United States Patent [19]
Nagata et al.

[11] Patent Number: 5,789,980
[45] Date of Patent: Aug. 4, 1998

[54] AMPLIFIER AND SEMICONDUCTOR DEVICE WHICH ARE OPERATED AT A LOW VOLTAGE

[75] Inventors: Mitsuru Nagata, Kanagawa-ken; Mariko Terada, Yokohama, both of Japan

[73] Assignee: Kabushiki Kaisha Toshiba, Kawasaki, Japan

[21] Appl. No.: 791,056

[22] Filed: Jan. 28, 1997

[30] Foreign Application Priority Data

Mar. 19, 1996 [JP] Japan ................ 8-062839

[51] Int. Cl.$^6$ ........................................ H03F 3/45
[52] U.S. Cl. .................. 330/253; 330/255; 330/257; 330/261
[58] Field of Search ...................... 330/253, 255, 330/257, 261

[56] References Cited

U.S. PATENT DOCUMENTS 4,800,339  1/1989  Tanimoto et al. ............ 330/253

*Primary Examiner*—James B. Mullins
*Attorney, Agent, or Firm*—Oblon, Spivak, McClelland, Maier & Neustadt, P.C.

[57] ABSTRACT

An amplifier and a semiconductor device according to the present invention are operated at a low voltage and decreased in size and problems such as a noise and an oscillation phenomenon. The amplifier and semiconductor device each includes a first bias generation circuit for generating first and second bias voltages when $V1 \geq V2$, where $V1$ is the power supply voltage and $V2$ is the lower limit of the operation limiting voltage, and for outputting a zero potential when $V1 < V2$, a first amplification circuit for amplifying an input signal by the first bias voltage and for opening an output terminal by the zero potential, a second amplification circuit of a push-pull type operated in response to the input signal and the output signal of the first amplification circuit, and a second bias generation circuit for supplying a bias current to the second amplification circuit by the zero potential when $V2 > V1 \geq V3$, where $V3$ ($<V2$) is a lower limit of the operation limiting voltage, and for opening the output terminal when $V1 \geq V2$. The second amplification circuit performs a push-pull operation when $V1 \geq V2$ and only one of push-pull transistors performs an amplification operation when $V2 > V1 \geq V3$.

4 Claims, 7 Drawing Sheets

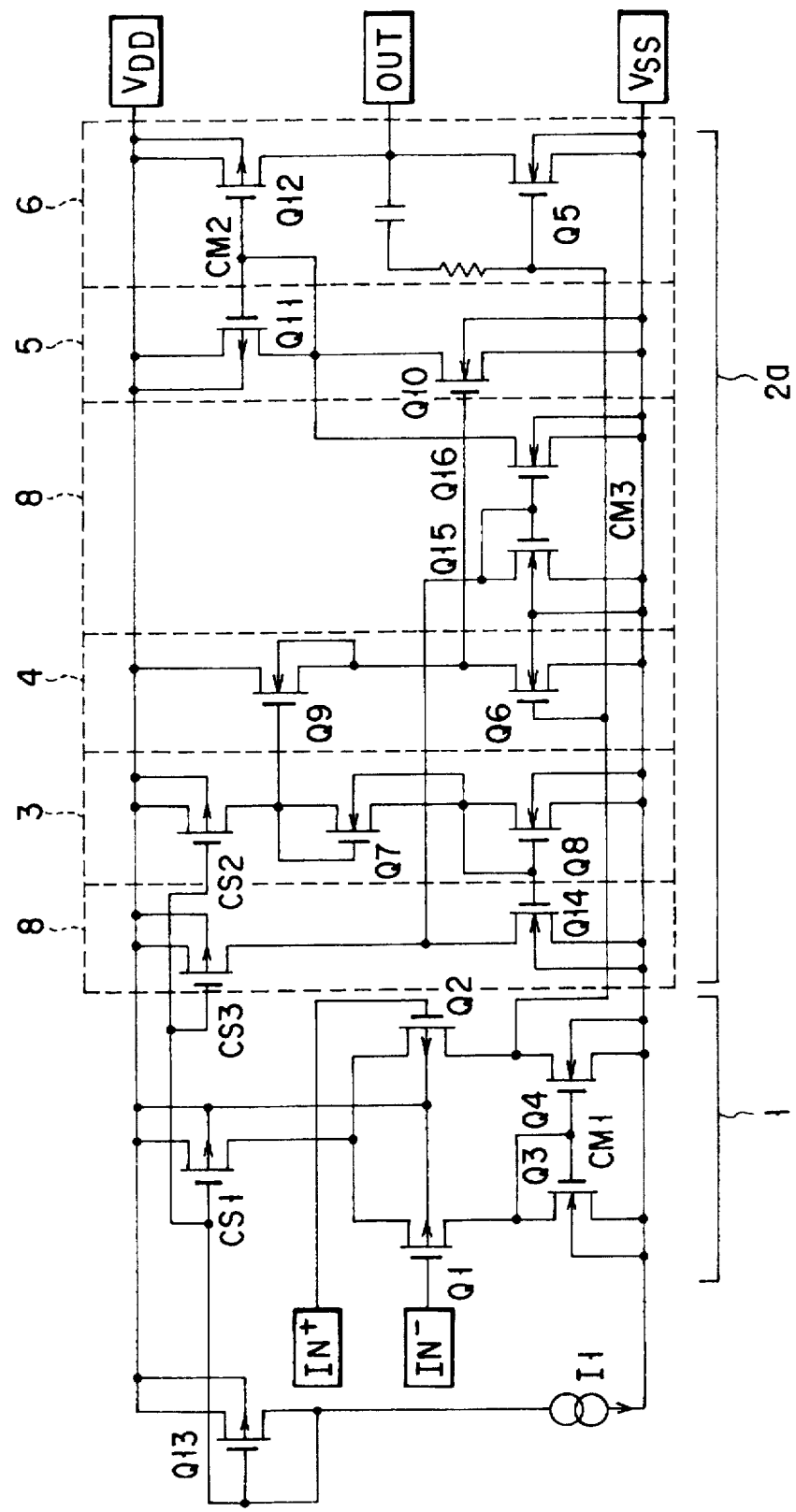
F I G. 4

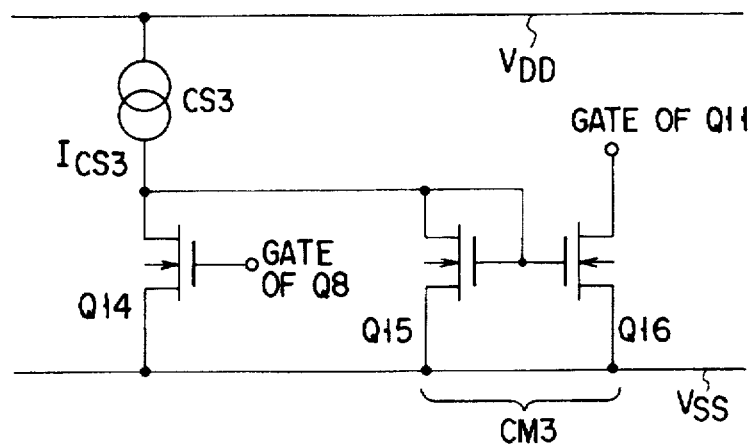
F I G. 5
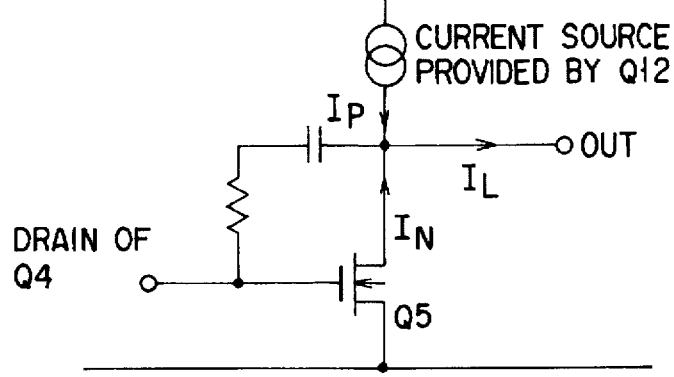
F I G. 6A
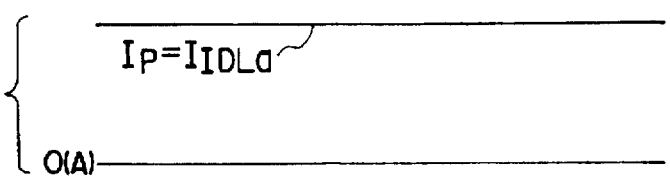
F I G. 6B
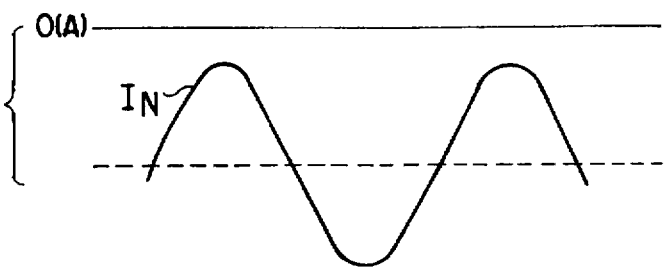
F I G. 6C
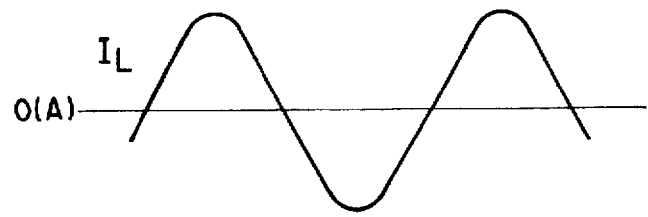
F I G. 6D

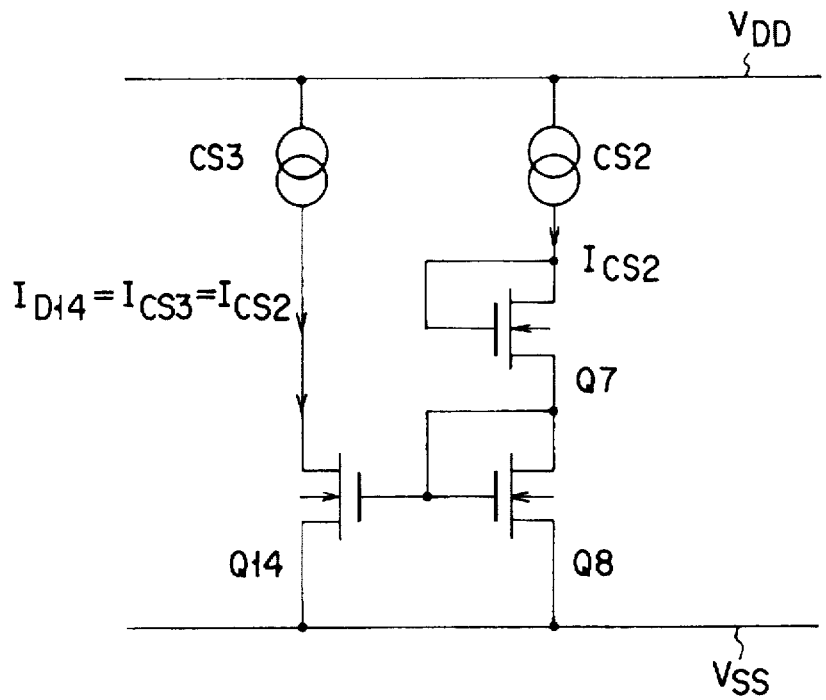
F I G. 7A
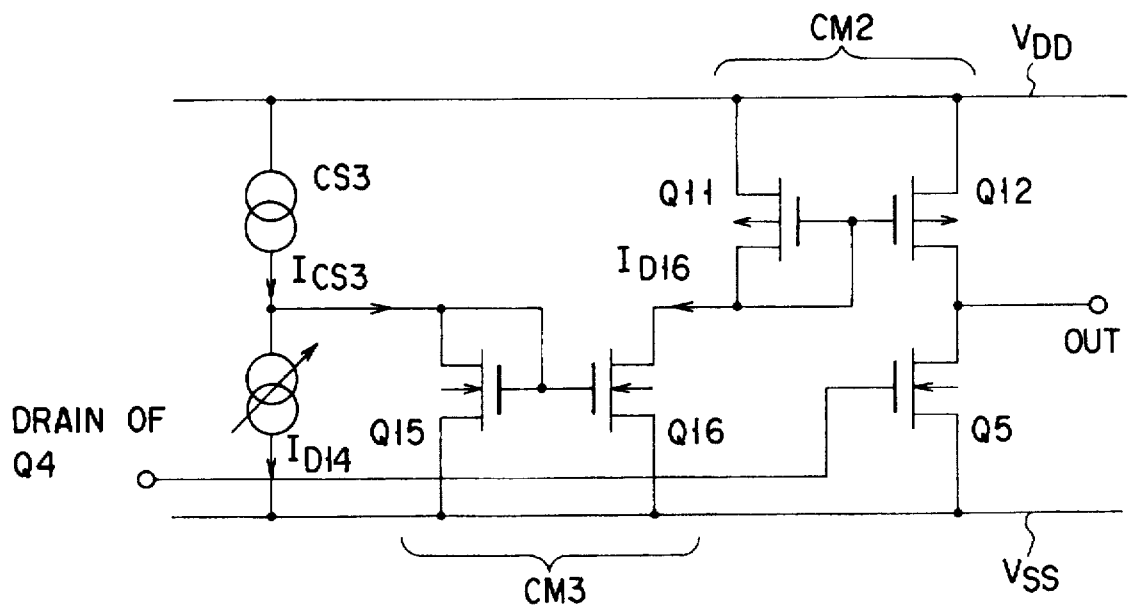
F I G. 7B

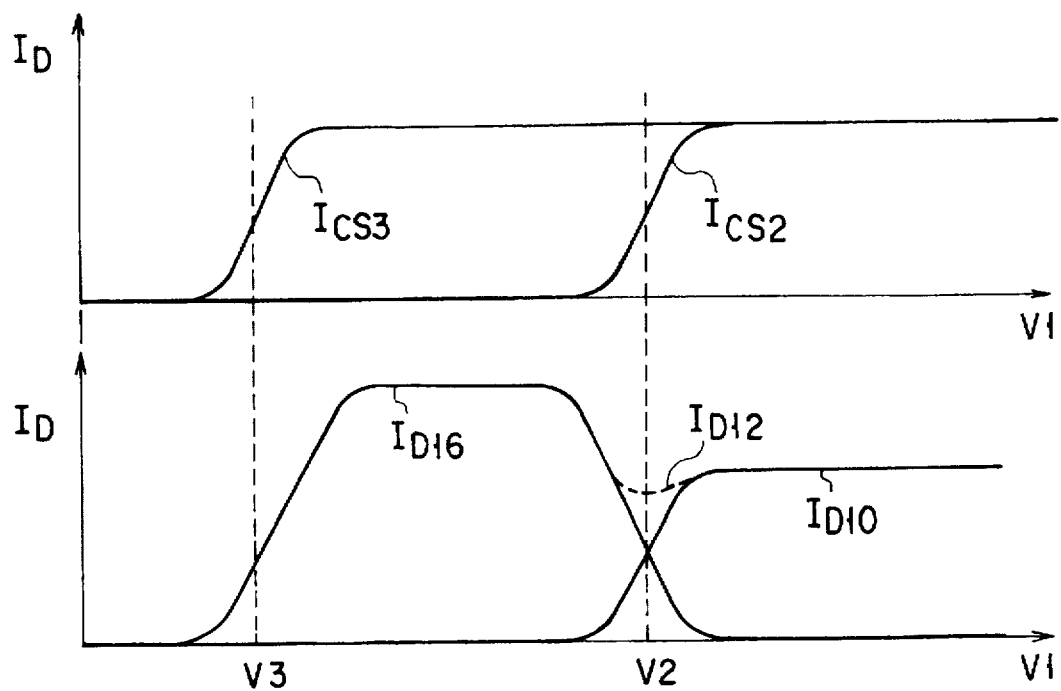
F I G. 8A
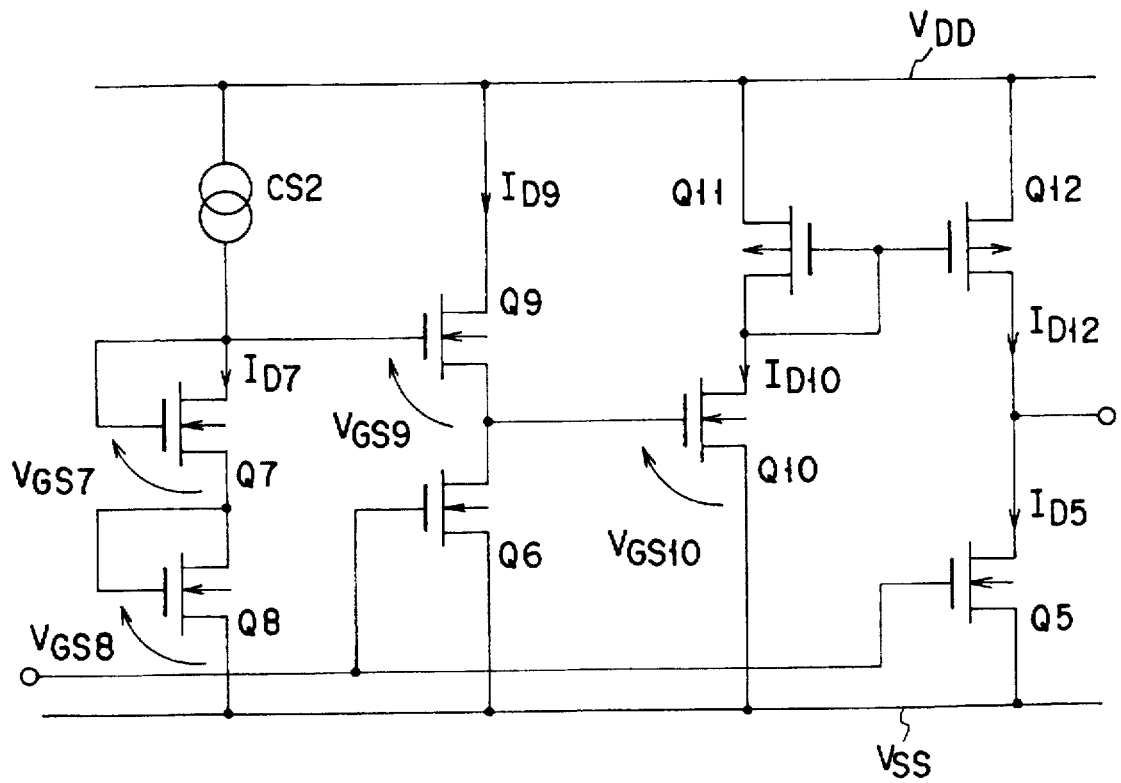
F I G. 8B

ABSTRACT

AMPLIFIER AND SEMICONDUCTOR DEVICE WHICH ARE OPERATED AT A LOW VOLTAGE

BACKGROUND OF THE INVENTION

This invention relates to an amplifier and a semiconductor device and, more particularly, to an improved amplifier driven at a low voltage.

FIG. 1 shows a typical circuit arrangement of an operational amplifier using a CMOS process, which is formed on an N-type semiconductor substrate. The operational amplifier supplies, to an output terminal OUT, an output signal corresponding to a gain-fold voltage difference between a non-inverted input signal IN⁺ and an inverted input signal IN⁻. The voltage gain usually ranges from 60 dB to 120 dB.

As shown in FIG. 1, the operational amplifier has a two-stage structure of an input differential amplifying stage 1 and an output stage 2.

The output stage 2 is constituted by cascade-connecting a series circuit 3 of constant current source CS2 and transistors Q7 and Q8, a series circuit 4 of transistors Q6 and Q9, a series circuit 5 of transistors Q10 and Q11, and a push-pull connection type circuit 6 of transistors Q5 and Q12. The output stage 2 has a complementary push-pull structure. Since the amplifier performs an AB-class operation by an adequate idle current flowing therethrough, its power consumption is low. The output signal of the amplifier has a large amplitude.

The circuit arrangement of the above operational amplifier will now be described in detail.

Power supply terminals $V_{DD}$ and $V_{SS}$ are formed on the N-type semiconductor substrate. The source and backgate of a P channel FET transistor (hereinafter referred to as a Pch transistor) Q13, whose gate and drain are connected to each other (diode connection), are connected to the power supply terminal $V_{DD}$. The gate and drain of the Pch transistor Q13 are connected to the power supply terminal $V_{SS}$ via a constant current source I1. The drain and gate of the transistor Q13 are connected to gates of Pch transistors constituting constant current sources CS1 and CS2 to form a current mirror circuit. The source of the transistor, which is one end of each of the constant current sources CS1 and CS2, is connected to the power supply terminal $V_{DD}$.

The gate of a Pch transistor Q1 is supplied with an inverted input signal, while that of a Pch transistor Q2 is supplied with a non-inverted input signal. The sources of the transistors Q1 and Q2 are connected to the other end of the constant current source CS1. The drain of the transistor Q1 is connected to the gate and drain of an N channel FET transistor (referred to as an Nch transistor hereinafter) Q3. The source and backgate of the Nch transistor Q3 is connected to the power supply terminal $V_{SS}$. The drain of the transistor Q2 is connected to that of an Nch transistor Q4. The source and backgate of the transistor Q4 are connected to the power supply terminal $V_{SS}$. The transistors Q1 to Q4 and constant current source CS1 constitute a differential amplifier.

The gate and drain of an Nch transistor Q7 is connected to the other end of the constant current source CS2, and the gate and drain of an Nch transistor Q8 is connected to the source and backgate of the transistor Q7. The gate of an Nch transistor Q9 is connected to the drain of the transistor Q7, the drain thereof is connected to the power supply terminal $V_{DD}$, and the source and backgate thereof is connected to the drain of an Nch transistor Q6.

The gate of an Nch transistor Q10 is connected to the drain of the transistor Q6, and the source and backgate thereof is connected to the power supply terminal $V_{SS}$. The gate of the transistor Q6 is connected to the drain of the transistor Q2. The transistors Q6 to Q9 and the constant current source CS2, that is, the foregoing series circuits 3 and 4 constitute an inverting amplifier 7.

The sources and backgates of Pch transistors Q11 and Q12 are connected to the power supply terminal $V_{DD}$, and the gates thereof are connected to the drain of the transistor Q11 and that of the transistor Q10. The transistors Q11 and Q12 constitute a current mirror circuit.

The gate of an Nch transistor Q5 is connected to the drain of the transistor Q2, the source and backgate thereof is connected to the power supply terminal $V_{SS}$, and the drain thereof is connected to the output terminal OUT and the drain of the transistor Q12. The transistors Q5 and Q12 are paired push-pull type transistors complementary to each other.

In the CMOS circuit shown in FIG. 1, the N-type semiconductor substrate is used. If a P-type substrate is used therein, the constitutions of both cases are the same, except for the connection of backgates.

An operation of the above prior art amplifier will now be described.

FIG. 2A schematically shows the prior art amplifier, while FIG. 2B does the inverting amplifier 7 used in the amplifier.

As shown in FIG. 2A, one of the paired push-pull transistors (referred to as a push-pull Tr pair), that is, the Nch transistor Q5 is directly driven by Q1, Q2 of the input differential amplifying stage 1. In contrast, the transistor Q10 is driven by the inverting amplifier 7 whose voltage gain is −1, and the paired transistors Q11 and Q12 constituting a current mirror circuit CM2 is driven by the transistor Q10.

As shown in FIG. 2B, the inverting amplifier 7 whose voltage gain is −1 includes an input terminal 7a, an output terminal 7b, a transistor Q6 and a biased transistor Q9. Let us ignore the channel length modulation effect for simplification. If the shapes of the transistors Q6 and Q9 of the inverting amplifier 7 are the same, the drain currents thereof are the same and so are the conductance values gm thereof. The voltage gain Av of the inverting amplifier 7 is thus expressed by the following equation (1):

$$Av = -gm \times (1/gm) = -1 \tag{1}$$

FIG. 3A is a circuit diagram for explaining the bias for operating the transistors in the output stage 2, and FIGS. 3B to 3D are waveforms for explaining operations of the push-pull Tr pair Q5 and Q12.

As is apparent from FIG. 3A, the voltage of the drain of transistor Q7 serves as a gate voltage of transistor Q9, the voltage of the source of transistor Q9 serves as a gate voltage of transistor Q10, and the voltage of the drain of transistor Q10 serves as a gate voltage of each of transistors Q11 and Q12. The transistors Q11 and Q12 constitute a current mirror circuit, and an operation point of transistors Q5 and Q12, i.e., an idle current $I_{IDL}$ is determined.

If, in the arrangement of FIG. 3A, the current of the constant current source CS2 is reduced, the following problem will arise.

An operation current $I_{D12}$ (current $I_P$) flows through the transistor Q12 which performs an AB-class operation by the idle current $I_{IDL}$ indicated by the dotted line as shown in FIG. 3B. Similarly, an operation current $I_{DS}$ (current $I_N$)

flows through the transistor Q5 which performs an AB-class operation by the idle current $I_{IDL}$ indicated by the dotted line as shown in FIG. 3C. As shown in FIG. 3D, a load current $I_L$ corresponding to an addition of operation currents $I_P$ and $I_N$ flows to the output terminal OUT. If the idle current $I_{IDL}$ is small, noise will occur in the load current $I_L$ in the transition from current $I_P$ to current $I_N$, and vice versa.

The current of the constant current source CS2 is decreased, as are the currents of the transistors Q6 and Q9 shown in FIG. 3A. Thus, the current of the inverting amplifier 7 of gain −1 on the input side of the transistor Q12 as shown in FIG. 2A, is considerably decreased, and the pole of the transfer function of the circuit comes to have a low frequency which cannot be ignored. Since, furthermore, the current of the circuit constituted of transistors Q10, Q11 and Q12 are extremely reduced, the pole of the transfer function of the circuit has a very low frequency. In this case, the phase cannot be compensated by a normal phase compensation circuit, with the result that an oscillation phenomenon occurs.

Moreover, the drive power of the output is extremely lowered, so that the waveform thereof is clipped or distorted greatly.

If the power supply voltage is gradually lowered in the amplifier of FIG. 1, the operation point of the constant current source CS2 enters a linear region from a saturation region of the FET transistor, i.e., an operation region of the constant current source CS2, and the current $I_{CS2}$ of the constant current source CS2 starts to reduce. Naturally, in this case, the idle current $I_{IDL}$ starts to decrease, and the above problem occurs. It is thus impossible to operate the amplifier at a low voltage.

Assuming that the drain current of a MOSFET transistor $Q_X$ is $I_{DX}$, the gate-to-source voltage of the transistor $Q_X$ is $V_{GSX}$, and the gate-to-source threshold voltage thereof is $V_T$, the drain current $I_{DX}$ is represented by the following equation:

$$I_{DX} = k1 \times (W/L) \times (V_{GSX} - V_T)^2 \quad (2)$$

where k1 is a constant, L is the length of the gate area between the source and drain in the direction from the source to the drain, and W is the width of the gate area between the source and drain in the direction perpendicular to the direction of the length L.

The equation (2) is rewritten as follows:

$$V_{GSX} = \{(I_{DX}/k1) \times (L/W)_x\}^{1/2} + V_T \quad (3)$$

Taking the bias in the output stage 2 into consideration, the voltage $V_{D7}$ at the drain of the transistor Q7 is given by the following equation:

$$V_{D7} = V_{GS7} + V_{GS8} \quad (4)$$
$$= 2 \times \{(I_{CS2}/k1) \times (L/W)_7\}^{1/2} + 2V_T$$

The following is a condition necessary for operating the transistor Q7:

$$V_{D7} > 2 V_T \quad (5)$$

It is necessary to consider that the upper limit of the threshold voltage $V_T$ is normally about 1.2 V since the threshold voltage varies at the time of massproduction. It is seen from the equation (5) that when the power supply voltage V1 between power supply terminals VDD and VSS approaches 2 $V_T$ (at worst 2.4 V), the operation point of the constant current source CS2 enters the linear region of the FET transistor, and the constant current source CS2 comes to serve as a resistor. In other words, the current $I_{CS2}$ of the constant current source suddenly approaches zero as the power supply voltage V1 decreases. Thus, an amplifying stage other than the input differential amplifying stage 1 is operated by an extraordinarily small amount of current, and the above-described oscillation phenomenon appears prominently.

BRIEF SUMMARY OF THE INVENTION

It is accordingly an object of the present invention to provide an amplifier and a semiconductor device which are operated at a low voltage and resolve problems, such as a noise and an oscillation phenomenon, without increasing in size.

To attain the above object, the amplifier and semiconductor device of the present invention are constituted as follows.

(1) An amplifier, as recited in claim 1, comprises: a first bias generation circuit connected to both a first power supply terminal and a second power supply terminal, for generating and outputting a first bias voltage from a first output terminal and generating and outputting a second bias voltage from a second output terminal when a lower limit of an operation power supply voltage is a first operation limiting voltage V2 and an absolute value of a power supply voltage V1 between the first power supply terminal and the second power supply terminal is equal to or larger than an absolute value of the first operation limiting voltage V2, a voltage of the first output terminal and a voltage of the second output terminal approaching a voltage of the second power supply terminal in accordance with a difference in absolute value between the power supply voltage V1 and the first operation limiting voltage V2, when the absolute value of the power supply voltage V1 is smaller than the absolute value of the first operation limiting voltage V2; a first amplification circuit connected to both the first power supply terminal and the second power supply terminal and having a first input terminal supplied with an input signal, a bias input terminal connected to the first output terminal of the first bias generation circuit, and a third output terminal, for amplifying an input signal and outputting an amplified signal as an output signal from the third output terminal when the first bias voltage is applied to the bias input terminal, the third output terminal being opened in accordance with a difference in absolute value between a voltage of the bias input terminal and a voltage of the second power supply terminal, when the voltage of the bias input terminal approaches the voltage of the second power supply terminal; a second amplification circuit connected to both the first power supply terminal and the second power supply terminal, and including a pair of push-pull transistors for supplying the output signal to a fourth output terminal, a second input terminal supplied with the output signal of the first amplification circuit, and a third input terminal supplied with the input signal; and a second bias generation circuit connected to both the first power supply terminal and the second power supply terminal and including a fourth input terminal connected to the second output terminal of the first bias generation circuit and a fifth output terminal connected to the second input terminal of the second amplification circuit, for generating and supplying a bias current, corresponding to a difference in voltage between the fourth input terminal and the second power supply terminal, to the fifth output terminal, when the lower limit of the operation power supply voltage is a second operation limiting voltage V3, an absolute value of the second operation limiting voltage V3 is smaller than the absolute value of the first operation limiting voltage V2, the absolute value of the power supply voltage V1 is equal to or larger than the absolute value of the second operation limiting voltage V3, and a voltage of the fourth input terminal approaches the voltage of the second power supply terminal, the fifth output terminal being opened when the absolute value of the power supply voltage is equal to or larger than the absolute value of the second operation limiting voltage V3 and the second bias voltage is applied to the fourth input terminal. The second amplification circuit performs a normal push-pull operation when the absolute value of the power supply voltage V1 is equal to or larger than the absolute value of the first operation limiting voltage V2, and only one of the push-pull transistors, which is driven in response to a signal supplied to the third input terminal of the second amplification circuit, performs a normal amplification operation when the absolute value of the power supply voltage V1 is smaller than the absolute value of the first operation limiting voltage V2 and equal to or larger than the absolute value of the second operation limiting voltage V3.

In the above-described amplifier, when the absolute value of the power supply voltage V1 is equal to or larger than that of the first operation limiting voltage V2, the first bias generation circuit causes an idle current to flow through the pair of push-pull transistors and to perform a push-pull operation. When the absolute value of the power supply voltage V1 is smaller than that of the first operation limiting voltage V2, the second bias generation circuit causes only one of the push-pull transistors to perform an amplifying operation. These two cases are suitably switched to each other. Consequently, even though the absolute value of the power supply voltage is low, the push-pull transistors will not malfunction. The second bias generation circuit allows the push-pull transistors to operate at an operation point where no great distortion occurs.

As recited in claim 2, the first bias generation circuit includes a first constant current source and a group of first transistors diode-connected in series with the first constant current source between the first power supply terminal and the second power supply terminal, and supplies a voltage as the first bias voltage from a drain of one of the first transistors to the first output terminal and supplies a voltage as the second bias voltage from between a gate and a source of one of the first transistors to the second output terminal. The source of one of the push-pull transistors of the second amplification circuit is connected to the first power supply terminal and a gate thereof is connected to the second input terminal, a gate of another push-pull transistor is connected to the third input terminal and a source thereof is connected to the second power supply terminal, and drains of both the push-pull transistors are connected to the output terminal. The first amplification circuit includes a first transistor for inverting-amplifying an input signal supplied from a gate thereof, a group of second transistors having at least one transistor formed between the first power supply terminal and the second power supply terminal and connected in series to the first transistor and also having one transistor whose gate corresponds to the bias input terminal, a second transistor, whose source is connected to the second power supply terminal and whose gate is connected to the drain of the first transistor, for inverting-amplifying a signal of the gate and supplying the signal to the third output terminal of the first amplification circuit, and a third transistor whose gate and drain are connected to the drain of the second transistor and whose source is connected to the first power supply terminal, the third transistor constituting a current mirror circuit together with the one of the push-pull transistors of the second amplification circuit. The second bias generation circuit includes a second constant current source, a fourth transistor connected in series to the second constant current source between the first power supply terminal and the second power supply terminal, the fourth transistor serving as a current mirror circuit by the second bias voltage applied between a gate and a source thereof, and a pair of current mirror transistors whose sources are connected to the second power supply terminal and whose gates are connected to a connection point of the second constant current source and the fourth transistor and a drain of one of the current mirror transistors, a drain of another current mirror transistor being connected to the fifth output terminal of the second bias generation circuit. When the absolute value of the power supply voltage V1 is equal to or larger than the absolute value of the first operation limiting voltage V2, the first bias generation circuit operates to cause a current to flow from the second constant current source to the fourth transistor and inhibit the current from flowing to the pair of current mirror transistors, and the push-pull transistors of the second amplification circuit performs a normal push-pull operation. When the absolute value of the power supply voltage V1 is smaller than the absolute value of the first operation limiting voltage V2 and equal to or larger than the absolute value of the second operation limiting voltage V3, the first bias generation circuit does not operate to inhibit the current from flowing from the second constant current source to the pair of current mirror transistors and cause the current to flow to the pair of current mirror transistors, whereby the third transistor and the one of the push-pull transistors of the second amplification circuit perform a constant current source operation, and the only one of the push-pull transistors, driven in response to the signal supplied to the third input terminal of the second amplification circuit, performs a normal amplification operation.

In the amplifier having the above-described constitution, the idle current of the push-pull transistors of the second amplification circuit is suitably switched, and the operation of the push-pull transistors and that of a single transistor are suitably switched to each other in accordance with the operations of the second constant current source, the fourth transistor and the pair of current mirror transistors. The push-pull transistors does not malfunction even though it is operated at a low voltage. Therefore, the amplifier is not increased in size but can normally be operated at a voltage lower than that in the prior art. The circuit arrangement of the amplifier is suitable for an apparatus operated at a low voltage, such as a portable electronic apparatus. The life time of such an apparatus can be lengthened.

(2) A semiconductor device, as recited in claim 3, comprises: a first bias generation circuit connected to both the first power supply terminal and the second power supply terminal, for generating and outputting a first bias voltage from a first output terminal and generating and outputting a second bias voltage from a second output terminal when a lower limit of an operation power supply voltage is a first operation limiting voltage V2 and an absolute value of a power supply voltage V1 between the first power supply terminal and the second power supply terminal is equal to or larger than an absolute value of the first operation limiting voltage V2, a voltage of the first output terminal and a voltage of the second output terminal approaching a voltage of the second power supply terminal in accordance with a difference in absolute value between the power supply voltage V1 and the first operation limiting voltage V2, when the absolute value of the power supply voltage V1 is smaller than the absolute value of the first operation limiting voltage V2; a first amplification circuit connected to both the first power supply terminal and the second power supply terminal and having a first input terminal supplied with an input signal, a bias input terminal connected to the first output terminal of the first bias generation circuit, and a third output terminal, for amplifying an input signal and outputting an amplified signal as an output signal from the third output terminal when the first bias voltage is applied to the bias input terminal, the third output terminal being opened in accordance with a difference in absolute value between a voltage of the bias input terminal and a voltage of the second power supply terminal, when the voltage of the bias input terminal approaches the voltage of the second power supply terminal; a second amplification circuit connected to both the first power supply terminal and the second power supply terminal, and including a pair of push-pull transistors for supplying the output signal to a fourth output terminal, a second input terminal supplied with the output signal of the first amplification circuit, and a third input terminal supplied with the input signal; and a second bias generation circuit connected to both the first power supply terminal and the second power supply terminal and including a fourth input terminal connected to the second output terminal of the first bias generation circuit and a fifth output terminal connected to the second input terminal of the second amplification circuit, for generating and supplying a bias current, corresponding to a difference in voltage between the fourth input terminal and the second power supply terminal, to the fifth output terminal, when the lower limit of the operation power supply voltage is a second operation limiting voltage V3, an absolute value of the second operation limiting voltage V3 is smaller than the absolute value of the first operation limiting voltage V2, the absolute value of the power supply voltage V1 is equal to or larger than the absolute value of the second operation limiting voltage V3, and a voltage of the fourth input terminal approaches the voltage of the second power supply terminal, the fifth output terminal being opened when the absolute value of the power supply voltage V1 is equal to or larger than the absolute value of the second operation limiting voltage V3 and the second bias voltage is applied to the fourth input terminal. The second amplification circuit performs a normal push-pull operation when the absolute value of the power supply voltage V1 is equal to or larger than the absolute value of the first operation limiting voltage V2, and only one of the push-pull transistors, which is driven in response to a signal supplied to the second input terminal of the second amplification circuit, performs a normal amplification operation when the absolute value of the power supply voltage V1 is smaller than the absolute value of the first operation limiting voltage V2 and equal to or larger than the absolute value of the second operation limiting voltage V3.

In the semiconductor device having the above constitution, the idle current of the push-pull transistors of the second amplification circuit is suitably switched, and the operation of the push-pull transistors and that of a single transistor are suitably switched to each other in accordance with the operation of the second bias generation circuit. The second bias generation circuit allows the push-pull transistors to operate at an operation point where no great distortion occurs. The push-pull transistors will not malfunction even when it is operated at a low voltage.

A semiconductor device, as recited in claim 4, which comprises: a first transistor having a gate serving as an input terminal, a source connected to a second power supply terminal, a drain connected to an output terminal, a channel of a first conductivity type; a second transistor having a gate connected to the input terminal, a source connected to the second power supply terminal, and a channel of the first conductivity type; a first constant current source one end of which is connected to a first power supply terminal; a third transistor having a gate and a drain both connected to another end of the first constant current source, and a channel of the first conductivity type; a fourth transistor having a gate and a drain both connected to a source of the third transistor, a source connected to the second power supply terminal, and a channel of the first conductivity type; a fifth transistor having a gate connected to the drain of the third transistor, a drain connected to the first power supply terminal, a source connected to a drain of the second transistor, and a channel of the first conductivity type; a sixth transistor having a gate connected to the drain of the second transistor, a source connected to the second power supply terminal, and a channel of the first conductivity type; a seventh transistor having a source connected to the first power supply terminal, a gate and a drain both connected to a drain of the sixth transistor, and a channel of a second conductivity type; an eighth transistor having a source connected to the source of the seventh transistor, a gate connected to the gate of the seventh transistor to constitute a current mirror circuit, a drain connected to the output terminal to constitute a pair of push-pull transistors together with the first transistor, and a channel of the second conductivity type; a second constant current source one end of which is connected to the first power supply terminal; a ninth transistor having a drain connected to another end of the second constant current source, a gate connected to the gate of the fourth transistor, a source connected to the second power supply terminal, and a channel of the first conductivity type; a tenth transistor having a source connected to the second power supply terminal, a gate and a drain both connected to the drain of the ninth transistor, and a channel of the first conductivity type; and an eleventh transistor having a source connected to the source of the tenth transistor, a gate connected to the gate of the tenth transistor to constitute a current mirror circuit, a drain connected to the gate of the seventh transistor, and a channel of the first conductivity type. When an absolute value of a power supply voltage V1 between the first power supply terminal and the second power supply terminal is equal to or larger than an absolute value of a first operation limiting voltage V2 for operating the first constant current source, the third transistor, and the fourth transistor, a current of the second constant current source is allowed to flow through the ninth transistor and prevented from flowing through the current mirror circuit constituted by the tenth transistor and the eleventh transistor, and the pair of push-pull transistors performs a normal push-pull operation. When the absolute value of the power supply voltage V1 is smaller than the absolute value of the first operation limiting voltage V2 and equal to or larger than an absolute value of a second operation limiting voltage V3 for operating the second constant current source and the ninth transistor, the current of the second constant current source is prevented from flowing through the ninth transistor and allowed to flow through the current mirror circuit constituted by the tenth transistor and the eleventh transistor, and the seventh transistor and the eighth transistor perform a constant current source operation and only the first transistor performs a normal amplification operation.

In the semiconductor device having the above constitution, when the absolute value of the power supply voltage V1 is equal to or larger than that of the first operation limiting voltage V2, an adequate idle current flows from the first constant current source to the first and eighth transistors constituting the push-pull pair of the output stage, and the push-pull pair performs a push-pull operation. When the absolute value of the power supply voltage V1 is smaller than that of the first operation limiting voltage V2, an idle current flows from the second constant current source to both the eight transistor and the first transistor, and only the first transistor performs an amplifying operation. These two cases are suitably switched to each other in accordance with the operations of the second constant current source and the ninth to eleventh transistors. The push-pull pair does not malfunction due to a sudden decrease in idle current even though it is operated at a low voltage. Consequently, the amplifier can be normally operated at a power supply voltage lower than that in the prior art. The circuit of the amplifier is not increased in size. The amplifier is suitable for an apparatus operated at a low voltage, such as a portable electronic apparatus, and its life time can be lengthened.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a circuit diagram showing the arrangement of an amplifier according to an embodiment of the present invention;

FIG. 5 is a circuit diagram for explaining the arrangement of the amplifier according to the embodiment of the present invention;

FIGS. 6A to 6D are views for explaining an operation of the amplifier according to the embodiment of the present invention;

FIGS. 7A and 7B are views for explaining another operation of the amplifier according to the embodiment of the present invention;

FIGS. 8A and 8B are views for explaining still another operation of the amplifier according to the embodiment of the present invention.

DETAILED DESCRIPTION OF THE INVENTION

Figure 1:
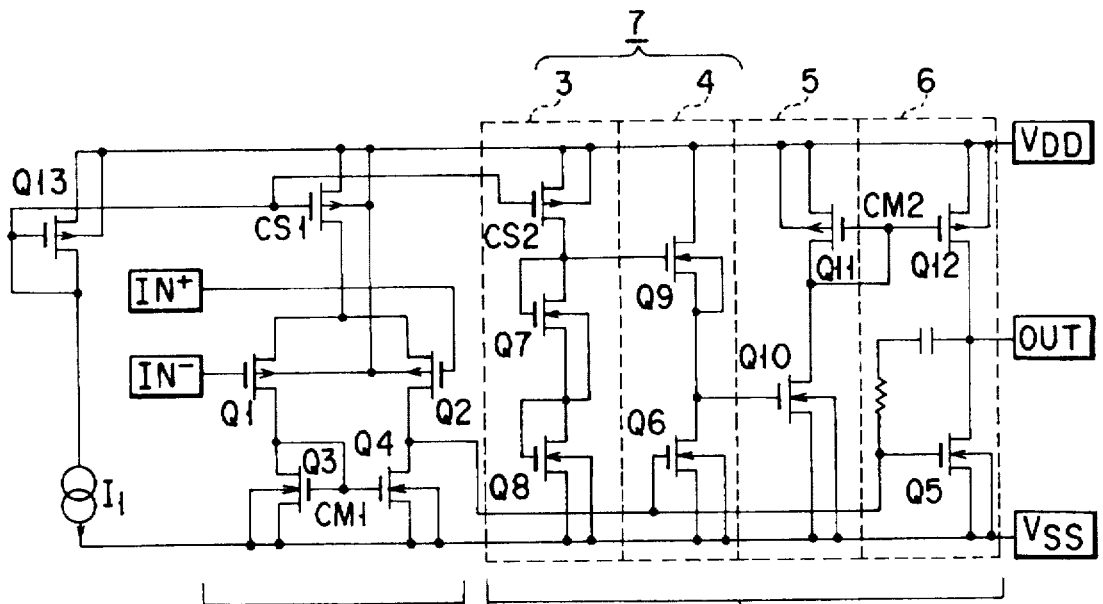
FIG. 1 is a circuit diagram showing an example of the arrangement of a prior art amplifier.
Figure 2A:
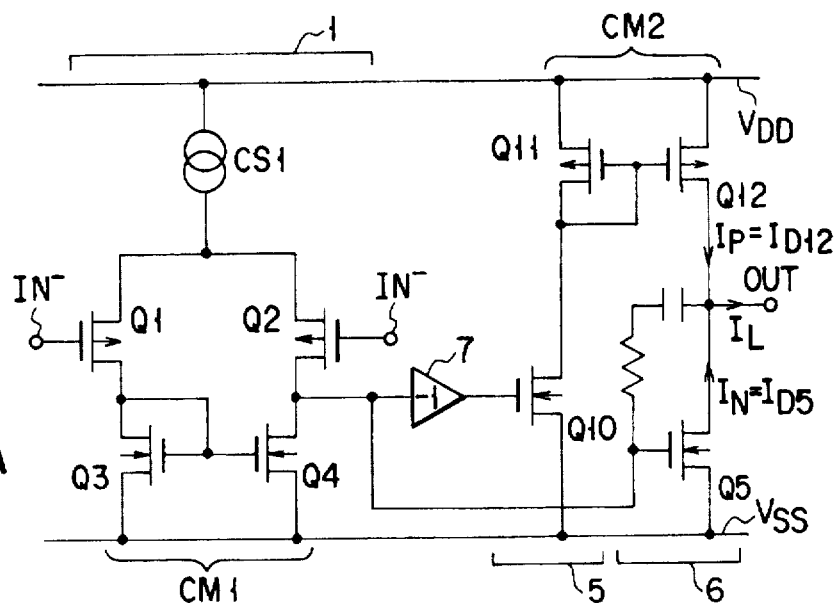
FIGS. 2A and 2B are circuit diagrams for explaining the arrangement of the prior art amplifier.
Figure 2B:
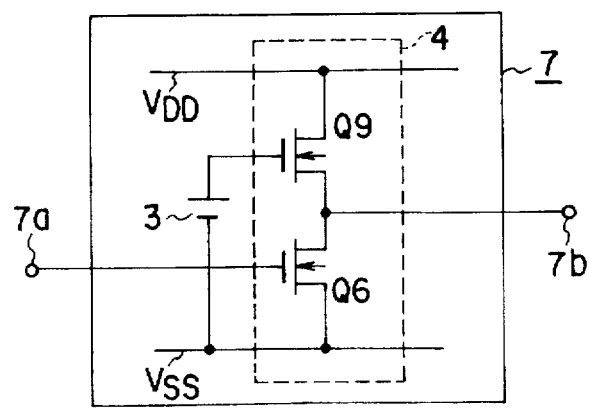
Figure 3A:
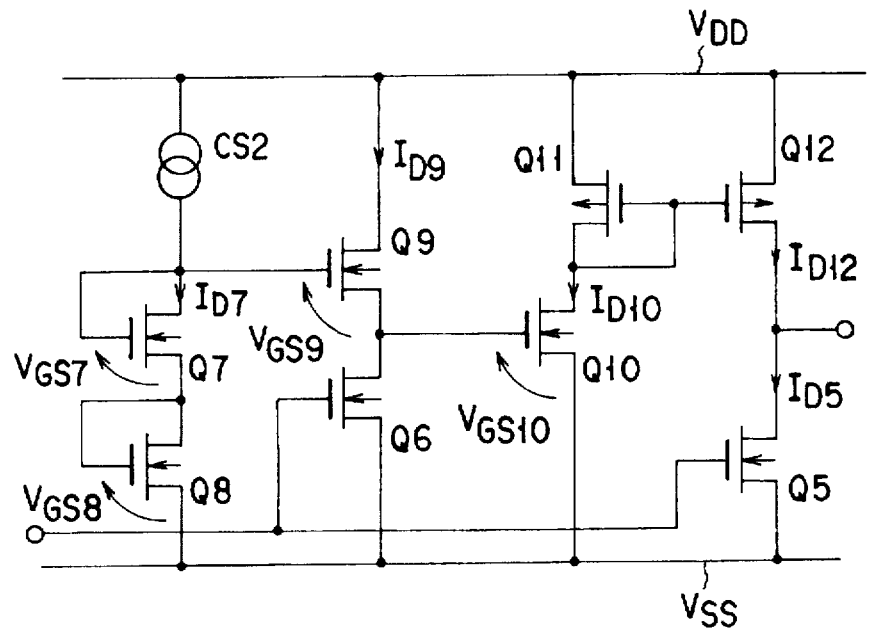
FIGS. 3A to 3D are views for explaining an operation of the prior art amplifier.
Figure 3B:
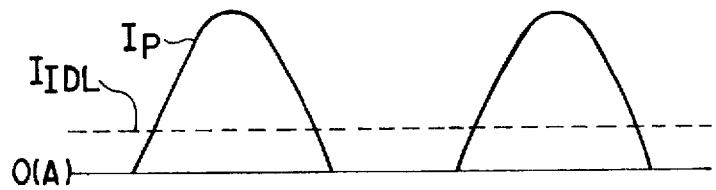
Figure 3C:
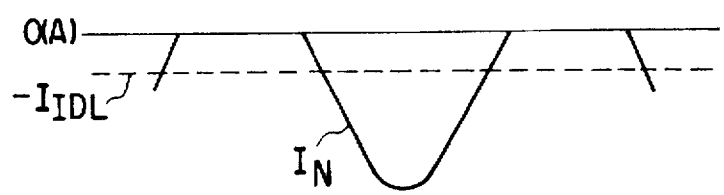
Figure 3D:
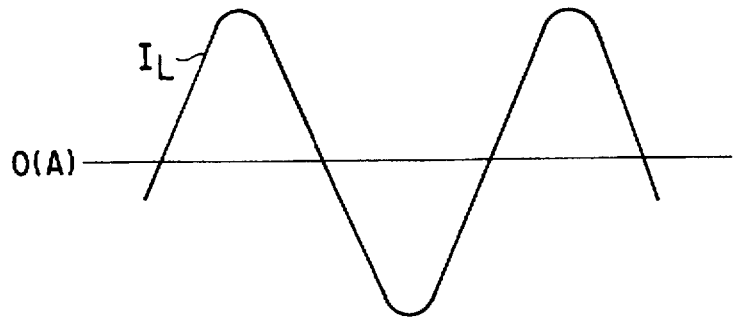

Embodiments of the present invention will now be described with reference to the accompanying drawings. The same constituents as those of FIG. 1 are indicated by the same reference numerals and their descriptions are omitted.

FIG. 4 illustrates a circuit arrangement of an amplifier formed on an N-type semiconductor substrate according to an embodiment of the present invention, and FIG. 5 does parts of the amplifier of FIG. 4 which differ from those of the prior art amplifier shown in FIG. 1.

Referring to FIG. 4, the amplifier has two stages of an input stage 1 and an output stage 2a. The input stage 1 includes input terminals IN$^+$ and IN$^-$ and a differential amplifier constituted of transistors Q1 to Q4 and a constant current source CS1.

The output stage 2a includes an amplifier circuit receiving a signal from the input stage 1. The amplifier circuit is constituted by cascade-connecting a series circuit 4 of transistors Q6 and Q9 and a series circuit 5 of transistors Q10 and Q11. The output stage 2a includes another amplifier circuit 6 having an output terminal OUT and receiving signals from both the input stage 1 and the amplifier circuit. The amplifier circuit 6 has push-pull type transistors Q5 and Q12. The stage 2a includes a first bias generation circuit 3 for generating a bias voltage applied to the series circuit 4 and a second bias generation circuit 8 for generating a bias current supplied to the amplifier circuit 6. The first bias generation circuit 3 has a series circuit of a constant current source CS2 and transistors Q7 and Q8, while the second bias generation circuit 8 is constituted by cascade-connecting a series circuit of a constant current source CS3 and a transistor Q14 and a current mirror circuit CM3 having a pair of current mirror transistors Q15 and Q16.

It is in the arrangement of the second bias generation circuit 8 that the first embodiment differs from the prior art amplifier shown in FIG. 1. The difference will now be described in detail with reference to FIG. 5. One end of the constant current source CS3 is connected to a positive power supply terminal VDD, and the other end thereof is connected to the drain of a transistor Q14. The source of the transistor Q14 is connected to a negative power supply terminal VSS. The gate of the transistor Q14 is connected to that of the transistor Q8 to constitute a current mirror circuit. The drain of the transistor Q14 is connected to the drain and gate of the transistor Q15. The transistors Q15 and Q16 are connected to each other at both gate and source thereby to constitute the current mirror circuit CM3. The drain of the transistor Q16 is connected to a connecting point of the source and gate of the transistor Q11, the gate of the transistor Q12 and the drain of the transistor Q10.

The voltage applied between the power supply terminals VDD and VSS is a power supply voltage V1. Assuming that the lower limit of an operation power supply voltage of the series circuit of constant current source CS2 and transistors Q7 and Q8 is an operation limiting voltage V2, while the lower limit of an operation power supply voltage of the series circuit of constant current source CS3 and transistor Q15 is an operation limiting voltage V3, the following expression is obtained on account of a difference in number of transistors, i.e., the presence or absence of transistor Q7:

|V2|>|V3|

An operation of the amplifier according to the first embodiment of the present invention will now be described. First, the operation is roughly explained as follows.

FIG. 6A is a view for explaining the operation of the amplifier, and FIGS. 6B to 6D are waveforms therefor.

As illustrated in FIG. 6A, the first embodiment of the present invention contains an amplifying operation of only the push-pull transistor Q5 as well as a normal push-pull operation of the prior art push-pull Tr pair. In this case, as shown in FIG. 6B, the transistor Q12 performs an operation of the constant current source, and the drain current $I_{D12}$ (current $I_p$) thereof becomes a direct current. This operation will be described later.

FIG. 7A illustrates the constant current sources CS2 and CS3 and transistors Q7, Q8 and Q14, while FIG. 7B is a diagram for explaining operations of the transistors Q14 to Q16 and constant current source CS3. FIG. 8A is a graph for explaining the operation of the constant current source CS3. In this graph, the ordinate represents drain current $I_D$ and the abscissa does power supply voltage V1. FIG. 8B is a diagram showing a relationship in bias.

If, as shown in FIGS. 7A and 8A, the absolute value of power supply voltage V1 is equal to or larger than that of the operation limiting voltage V2 ($|V1| \geq |V2|$), the transistors Q7 and Q8 and constant current source CS2 each performs the same operation as that in the prior art amplifier. In other words, the current $I_{CS2}$ of the constant current source CS2 flows in the same manner as in the prior art. Consequently, both the transistors Q6 and Q9 normally operate to allow the drain current $I_{D10}$ of the transistor Q10 to flow, and the push-pull Tr pair of the output stage 2a performs the same operation as that in the prior art.

When $|V2| > |V1| \geq |V3|$, the current $I_{CS2}$ of the constant current source CS2 does not flow. As shown in FIG. 7B, the current flowing to the transistor Q14 is decreased, the current flows to the transistor Q15, and the drain current $I_{D16}$ of the transistor Q16 flows. In other words, the conventional operation is shifted to the amplifying operation of only the transistor Q5 of the push-pull Tr pair of the output stage 2a by both the current $I_{CS3}$ of the constant current source CS3 and the drain current $I_{D16}$.

Next, the operation of the amplifier will be described in detail. If, as shown in FIGS. 8A and 8B, the absolute value of V1 is equal to or larger than that of V2, the constant current source CS2 performs an intrinsic constant current operation, and the current values $I_{CS2}$ and $I_{CS3}$ of the constant current sources CS2 and CS3 are equal to each other, the transistor Q9 is normally operated by the drain voltage (bias voltage) of the transistor Q7. Since the current of the constant current source CS3 of FIG. 7A flows through the transistor Q14, no current flows between the drains of transistors Q14 and Q15, which is equivalent to an opening state. Therefore, no current flows through the transistor Q15 or through the gate of the transistor Q16, which is also equivalent to the opening state. Consequently, no influence is exercised upon the push-pull Tr pair of the current mirror circuit CM3, and the transistors Q5 and Q12 of the push-pull Tr pair carry out a push-pull operation.

If, as shown in FIG. 8A, the power supply voltage V1 between the power supply terminals VDD and VSS lowers, and the constant current source CS2 shifts to a linear region from a saturation region of the FET transistor, that is, from an operation region of the constant current source, the drain current $I_{DS}$ of the transistor Q8 starts to reduce. The drain voltage of the transistor Q8 approaches the voltage of the power supply terminal VSS, while the drain voltage of the transistor Q7 also does that of the power supply terminal VSS. The drain current $I_{D14}$ of transistor Q14 thus decreases, as shown in FIG. 7B, and so does the drain current of transistors Q9 and Q10, with the result that neither of transistors Q6 and Q10 performs an amplifying operation. The constant current source CS3 normally operates, and current starts to flow from the source CS3 to the transistor Q15, and a fixed amount of current flows through the current mirror circuits CM2 and CM3. The transistor Q12 thus starts to shift from an amplifying operation to a constant current source operation.

If, as shown in FIG. 8A, the power supply voltage V1 lowers further and its absolute value is equal to or smaller than that of the operation limiting voltage V2 and equal to or larger than that of the operation limiting voltage V3, no current is supplied from the constant current source CS2 and the power supply voltage V1 becomes a completely low voltage and, in this case, the drain current of transistors Q8, Q9, Q10 and Q14 is reduced and the transistor Q6 stops its operation. The current of constant current source CS3 flows through the transistors Q15 and Q16 of the current mirror circuit CM3. The transistors Q11 and Q12 are fixedly biased by the operation of the current mirror circuit CM2. As illustrated in FIG. 6A, the operation of the push-pull Tr pair of the output stage 2a is shifted to that of an amplifier of only the transistor Q5 (hereinafter referred to as a single amplifying operation). In FIG. 8A, the sum of drain current $I_{D16}$ of transistor Q16 and idle current $I_{D10}$ of transistor Q10 corresponds to idle current ID12 of transistor Q12 indicated by the dotted line.

The above-described operation is summarized as follows. If the power supply voltage is decreased, the first bias generation circuit 3 for setting the idle current of the push-pull Tr pair of the output stage 2, that is, the constant current source CS2 and transistors Q7 and Q8 are not normally operated, thus causing an unusual phenomenon. The amplifier according to the first embodiment of the present invention is so constituted that the output stage 2a performs an amplifying operation even when the bias generation circuit 3 is not normally operated. In other words, the transistors Q8 and Q14 detect the current of constant current source CS2, and the first bias generation circuit 3 outputs a voltage (hereinafter referred to as a zero potential) at which the circuit of the succeeding stage is not operated. The drain of the transistor Q10 is opened by the zero potential. The amplifying operation of the transistor Q12 of the output stage 2a is switched to an operation of an active load (an operation of a constant current source) by the operation of the second bias generation circuit 8, i.e., by that of the transistor Q16 caused by the bias current from the transistor Q14. Thus, the single amplifying operation of the transistor Q5 is performed. The idle current $I_{IDLa}$ of the push-pull Tr pair is set by the active load Q12, with the result that the amplifier can be operated at a low voltage. In other words, in a circuit for determining the idle current $I_{IDLa}$, the constant current source CS2 is switched to the constant current source CS3 the lower limit of the operation region of which is low. The active load Q12 thus allows the output stage 2a to be operated at a low voltage.

The bias for operating the above-described transistors will now be described.

In a push-pull operation as shown in FIG. 8B, the following equation (5) is set up by the Kirchhoff's laws.

$$V_{GS7}+V_{GS8}=V_{GS9}+V_{GS10} \tag{5}$$

If the transistors Q7 to Q10, Q15 and Q16 are the same in shape, the following equation (6) is obtained from the equations (3) and (5).

$$2 \times (I_{CS2})^{1/2}=(I_{D9})^{1/2}+(I_{D10})^{1/2} \tag{6}$$

If the ratio of W/L of transistor Q5 to that of transistor Q6 is a, the following equations (7) and (8) are set up.

$$a=(W/L)_{Q5}/(W/L)_{Q6} \tag{7}$$

$$I_{DS}=a \times I_{D6}=a \times I_{D9} \tag{8}$$

If the ratio of W/L of transistor Q12 to that of transistor Q11 is b, the following equations (7) and (8) are set up.

$$b = (W/L)_{Q12}/(W/L)_{Q11} \tag{9}$$

$$I_{D12} = b \times I_{D11} = b \times I_{D10} \tag{10}$$

The idle current $I_{IDL}$ of the push-pull Tr pair of the output stage 2a does not flow through the load, and the following equation (11) is given.

$$I_{D12} = I_{DS} = I_{IDL} \tag{11}$$

From the above equations (6), (8), (10) and (11), the following equation is obtained.

$$2 \times (I_{CS2})^{1/2} = (I_{IDL}/a)^{1/2} + (I_{IDL}/b)^{1/2}$$
$$= (a^{-1/2} + b^{-1/2}) \times I_{IDL}^{1/2}$$

$$I_{IDL} = 4 \times I_{CS2}/(a^{-1/2} + b^{-1/2})^2 \tag{12}$$

It is apparent from the above that the idle current $I_{IDL}$ is set by the constant current source CS2.

In the single amplifying operation shown in FIG. 6A, as shown in FIG. 6B, the operation waveform of the transistor Q12, that is, the waveform of the drain current $I_{D12}$ (current $I_P$) of the transistor Q12 represents a direct current, i.e., an idle current $I_{IDLa}$. As shown in FIG. 6C, the waveform of drain current $I_N$ (operation current $I_{DS}$) of transistor Q5 shows a single amplifying operation. As shown in FIG. 6D, the sum of currents $I_P$ and $I_N$ of the push-pull Tr pair corresponds to the load current $I_L$ of the output terminal OUT. Since, in this case, the positive side of the load current $I_L$ does not have a current value higher than current $I_P$, the current $I_P$ has to be set higher than a value of necessary load current. As is apparent from the following equation (13), the idle current $I_{IDLa}$ of the transistor Q5 is set by the constant current source CS3 and supplied through the transistors Q11, Q12, Q15 and Q16.

$$I_{IDLA} = I_{D12a} = b \times I_{D11} = b \times I_{D16} = b \times I_{D15} = b \times I_{CS3} \tag{13}$$

The idle current $I_{IDLA}$ is equal to current $I_P$ and increased more greatly than in the AB-class operation. Since, however, the single amplifying operation starts when the power supply voltage becomes considerably low, power consumption is not a serious problem.

The current $I_{CS3}$ of the constant current source CS3 need not be correctly equal to the current $I_{CS2}$ of the constant current source CS2, but has only to have a value enough to perform the above operation.

Figure 9:
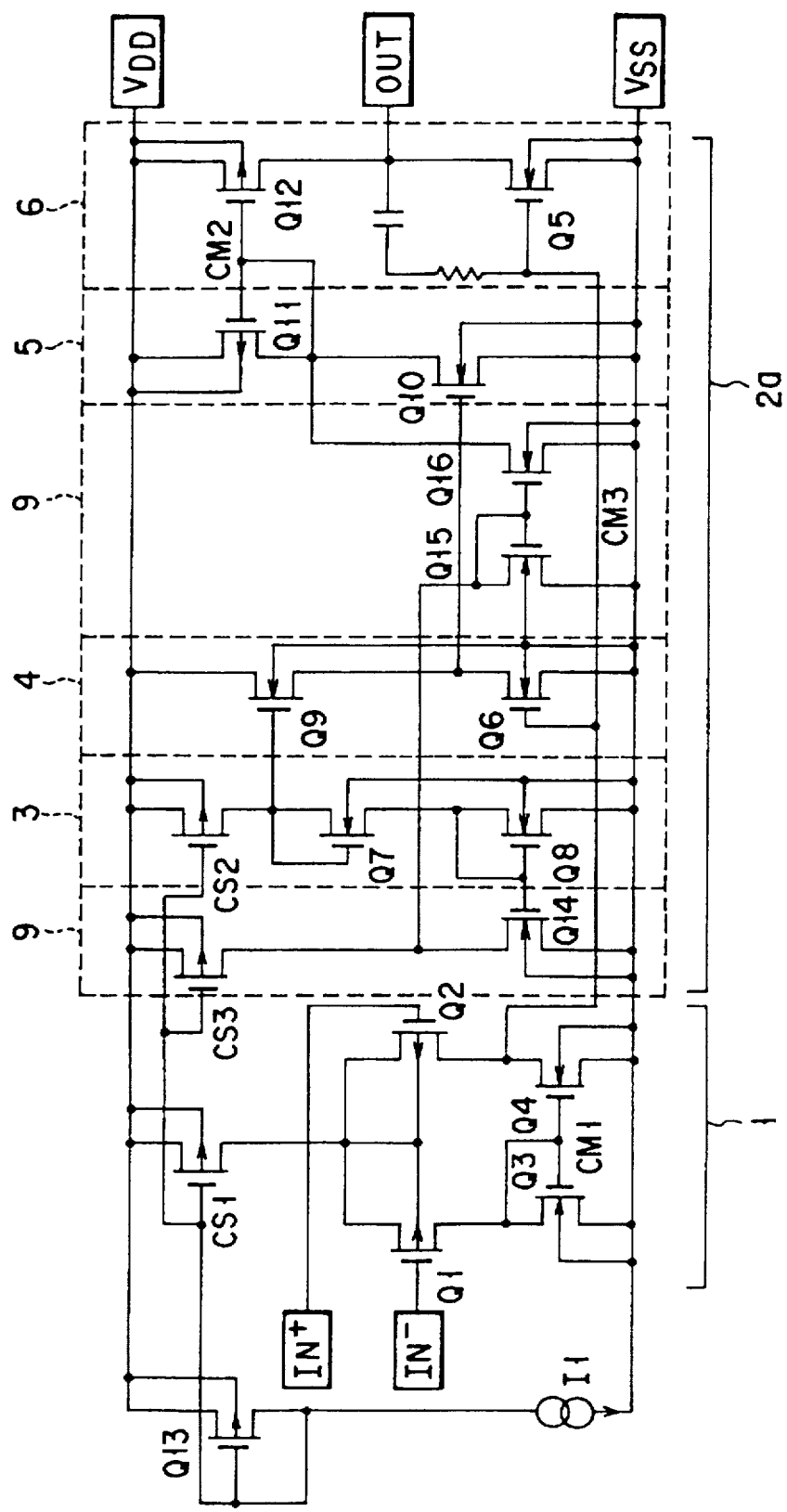
FIG. 9 is a circuit diagram showing the arrangement of an amplifier according to another embodiment of the present invention.

FIG. 9 illustrates a circuit arrangement of an amplifier formed on a P-type semiconductor substrate according to a second embodiment of the present invention. The circuit arrangement of the second embodiment is the same as that of the first embodiment, except for the connection of back-gates of transistors Q1, Q2, Q7 and Q9. Constant current sources CS1, CS2 and CS3, a current mirror circuit CM3, push-pull Tr pair Q5 and Q12, transistors Q1 to Q4, Q6 to Q11, Q14 and Q15 can be constituted of bipolar transistors as well as FET transistors.

If the amplifier includes an input stage 1 having transistors Q1 to Q4, it functions as an operational amplifier. It does not matter whether the amplifier includes the input stage 1.

According to the above embodiments, in the case where the absolute value of the power supply voltage V1 is equal to or larger than that of the operation limiting voltage V2, an adequate idle current $I_{IDL}$ flows through the push-pull Tr pair Q5 and Q12 of the output stage from the constant current source CS2, and a push-pull operation is carried out. In the case where the absolute value of the power supply voltage V1 is smaller than that of the operation limiting voltage V2, the idle current $I_{IDLa}$ flows from the constant current source CS3 to the transistor Q5, and only the transistor Q5 performs an amplifying operation. Even though the above two cases are suitably switched to each other according to the operations of the constant current sources CS2 and CS3 and transistors Q14 to Q16 and the power supply voltage is low, there occurs no problems due to a sharp decrease in idle current of push-pull Tr pair Q5 and Q12 of the output stage 2a. The amplifier is thus normally operated even at a power supply voltage which is about 1 V lower than that in the prior art. Since, furthermore, three transistors (Q14, Q15 and Q16) and one constant current source (CS3) are simply added, the circuit is not increased in size. The amplifier of the present invention is suitable for a circuit operated at a low power supply voltage, such as a portable electronic apparatus, and its life time can be lengthened. Moreover, the constant current sources CS2 and CS3 allow the push-pull transistors Q5 and Q12 or only the transistor Q5 to operate at an operation point where no great distortion occurs.

As described above, the present invention can be provided with an amplifier and a semiconductor device which are operated at a low voltage and decreased in size and in problems such as a noise and an oscillation phenomenon.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. An amplifier comprising:

a first power supply terminal;

a second power supply terminal;

a first bias generation circuit connected to both the first power supply terminal and the second power supply terminal, for generating and outputting a first bias voltage from a first output terminal and generating and outputting a second bias voltage from a second output terminal when a lower limit of an operation power supply voltage is a first operation limiting voltage and an absolute value of a power supply voltage between the first power supply terminal and the second power supply terminal is equal to or larger than an absolute value of the first operation limiting voltage, a voltage of the first output terminal and a voltage of the second output terminal approaching a voltage of the second power supply terminal in accordance with a difference in absolute value between the power supply voltage and the first operation limiting voltage, when the absolute value of the power supply voltage is smaller than the absolute value of the first operation limiting voltage;

a first amplification circuit connected to both the first power supply terminal and the second power supply terminal and having a first input terminal supplied with an input signal, a bias input terminal connected to the first output terminal of the first bias generation circuit, and a third output terminal, for amplifying an input signal and outputting an amplified signal as an output signal from the third output terminal when the first bias voltage is applied to the bias input terminal, the third output terminal being opened in accordance with a difference in absolute value between a voltage of the bias input terminal and a voltage of the second power supply terminal, when the voltage of the bias input terminal approaches the voltage of the second power supply terminal;

a second amplification circuit connected to both the first power supply terminal and the second power supply terminal, and including a pair of push-pull transistors for supplying the output signal to a fourth output terminal, a second input terminal supplied with the output signal of the first amplification circuit, and a third input terminal supplied with the input signal; and a second bias generation circuit connected to both the first power supply terminal and the second power supply terminal and including a fourth input terminal connected to the second output terminal of the first bias generation circuit and a fifth output terminal connected to the second input terminal of the second amplification circuit, for generating and supplying a bias current, corresponding to a difference in voltage between the fourth input terminal and the second power supply terminal, to the fifth output terminal, when the lower limit of the operation power supply voltage is a second operation limiting voltage, an absolute value of the second operation limiting voltage is smaller than the absolute value of the first operation limiting voltage, the absolute value of the power supply voltage is equal to or larger than the absolute value of the second operation limiting voltage, and a voltage of the fourth input terminal approaches the voltage of the second power supply terminal, the fifth output terminal being opened when the absolute value of the power supply voltage is equal to or larger than the absolute value of the first operation limiting voltage and the second bias voltage is applied to the fourth input terminal, wherein the second amplification circuit performs a normal push-pull operation when the absolute value of the power supply voltage is equal to or larger than the absolute value of the first operation limiting voltage, and only one of the push-pull transistors, which is driven in response to a signal supplied to the third input terminal of the second amplification circuit, performs a normal amplification operation when the absolute value of the power supply voltage is smaller than the absolute value of the first operation limiting voltage and equal to or larger than the absolute value of the second operation limiting voltage.

2. The amplifier according to claim 1, wherein the first bias generation circuit includes a first constant current source and a group of first transistors diode-connected in series with the first constant current source between the first power supply terminal and the second power supply terminal, and supplies a voltage as the first bias voltage from a drain of one of the first transistors to the first output terminal and supplies a voltage as the second bias voltage from between a gate and a source of one of the first transistors to the second output terminal;

a source of one of the push-pull transistors of the second amplification circuit is connected to the first power supply terminal and a gate thereof is connected to the second input terminal, a gate of another push-pull transistor is connected to the third input terminal and a source thereof is connected to the second power supply terminal, and drains of both the push-pull transistors are connected to the fourth output terminal;

the first amplification circuit includes a first transistor for inverting-amplifying an input signal supplied from a gate thereof, a group of second transistors having at least one transistor formed between the first power supply terminal and the second power supply terminal and connected in series to the first transistor and also having one transistor whose gate corresponds to the bias input terminal, a second transistor, whose source is connected to the second power supply terminal and whose gate is connected to the drain of the first transistor, for inverting amplifying a signal of the gate and supplying the signal to the third output terminal of the first amplification circuit, and a third transistor whose gate and drain are connected to the drain of the second transistor and whose source is connected to the first power supply terminal, the third transistor constituting a current mirror circuit together with the one of the push-pull transistors of the second amplification circuit;

the second bias generation circuit includes a second constant current source, a fourth transistor connected in series to the second constant current source between the first power supply terminal and the second power supply terminal, the fourth transistor serving as a current mirror circuit by the second bias voltage applied between a gate and a source thereof, and a pair of current mirror transistors whose sources are connected to the second power supply terminal and whose gates are connected to a connection point of the second constant current source and the fourth transistor and a drain of one of the current mirror transistors, a drain of another current mirror transistor being connected to the fifth output terminal of the second bias generation circuit;

when the absolute value of the power supply voltage is equal to or larger than the absolute value of the first operation limiting voltage, the first bias generation circuit operates to cause a current to flow from the second constant current source to the fourth transistor and inhibit the current from flowing to the pair of current mirror transistors, and the push-pull transistors of the second amplification circuit performs a normal push-pull operation and, when the absolute value of the power supply voltage is smaller than the absolute value of the first operation limiting voltage and equal to or larger than the absolute value of the second operation limiting voltage, the first bias generation circuit does not operate to inhibit the current from flowing from the second constant current source to the pair of current mirror transistors and cause the current to flow to the pair of current mirror transistors, whereby the third transistor and the one of the push-pull transistors of the second amplification circuit perform a constant current source operation, and the only one of the push-pull transistors, driven in response to the signal supplied to the third input terminal of the second amplification circuit, performs a normal amplification operation.

3. A semiconductor device comprising:

a first power supply terminal;

a second power supply terminal;

a first bias generation circuit connected to both the first power supply terminal and the second power supply terminal, for generating and outputting a first bias voltage from a first output terminal and generating and outputting a second bias voltage from a second output terminal when a lower limit of an operation power supply voltage is a first operation limiting voltage and an absolute value of a power supply voltage between the first power supply terminal and the second power supply terminal is equal to or larger than an absolute value of the first operation limiting voltage, a voltage of the first output terminal and a voltage of the second output terminal approaching a voltage of the second power supply terminal in accordance with a difference in absolute value between the power supply voltage and the first operation limiting voltage, when the absolute value of the power supply voltage is smaller than the absolute value of the first operation limiting voltage;

a first amplification circuit connected to both the first power supply terminal and the second power supply terminal and having a first input terminal supplied with an input signal, a bias input terminal connected to the first output terminal of the first bias generation circuit, and a third output terminal, for amplifying an input signal and outputting an amplified signal as an output signal from the third output terminal when the first bias voltage is applied to the bias input terminal, the third output terminal being opened in accordance with a difference in absolute value between a voltage of the bias input terminal and a voltage of the second power supply terminal, when the voltage of the bias input terminal approaches the voltage of the second power supply terminal;

a second amplification circuit connected to both the first power supply terminal and the second power supply terminal, and including a pair of push-pull transistors for supplying the output signal to a fourth output terminal, a second input terminal supplied with the output signal of the first amplification circuit, and a third input terminal supplied with the input signal; and a second bias generation circuit connected to both the first power supply terminal and the second power supply terminal and including a fourth input terminal connected to the second output terminal of the first bias generation circuit and a fifth output terminal connected to the second input terminal of the second amplification circuit, for generating and supplying a bias current, corresponding to a difference in voltage between the fourth input terminal and the second power supply terminal, to the fifth output terminal, when the lower limit of the operation power supply voltage is a second operation limiting voltage, an absolute value of the second operation limiting voltage is smaller than the absolute value of the first operation limiting voltage, the absolute value of the power supply voltage is equal to or larger than the absolute value of the second operation limiting voltage, and a voltage of the fourth input terminal approaches the voltage of the second power supply terminal, the fifth output terminal being opened when the absolute value of the power supply voltage is equal to or larger than the absolute value of the first operation limiting voltage and the second bias voltage is applied to the fourth input terminal, wherein the second amplification circuit performs a normal push-pull operation when the absolute value of the power supply voltage is equal to or larger than the absolute value of the first operation limiting voltage, and only one of the push-pull transistors, which is driven in response to a signal supplied to the third input terminal of the second amplification circuit, performs a normal amplification operation when the absolute value of the power supply voltage is smaller than the absolute value of the first operation limiting voltage and equal to or larger than the absolute value of the second operation limiting voltage.

4. A semiconductor device comprising:

a first power supply terminal;

a second power supply terminal;

a first transistor having a gate serving as an input terminal, a source connected to the second power supply terminal, a drain connected to an output terminal, a channel of a first conductivity type;

a second transistor having a gate connected to the input terminal, a source connected to the second power supply terminal, and a channel of the first conductivity type;

a first constant current source one end of which is connected to the first power supply terminal;

a third transistor having a gate and a drain both connected to another end of the first constant current source, and a channel of the first conductivity type;

a fourth transistor having a gate and a drain both connected to a source of the third transistor, a source connected to the second power supply terminal, and a channel of the first conductivity type;

a fifth transistor having a gate connected to the drain of the third transistor, a drain connected to the first power supply terminal, a source connected to a drain of the second transistor, and a channel of the first conductivity type;

a sixth transistor having a gate connected to the drain of the second transistor, a source connected to the second power supply terminal, and a channel of the first conductivity type;

a seventh transistor having a source connected to the first power supply terminal, a gate and a drain both connected to a drain of the sixth transistor, and a channel of a second conductivity type;

an eighth transistor having a source connected to the source of the seventh transistor, a gate connected to the gate of the seventh transistor to constitute a current mirror circuit, a drain connected to the output terminal to constitute a pair of push-pull transistors together with the first transistor, and a channel of the second conductivity type;

a second constant current source one end of which is connected to the first power supply terminal;

a ninth transistor having a drain connected to another end of the second constant current source, a gate connected to the gate of the fourth transistor, a source connected to the second power supply terminal, and a channel of the first conductivity type;

a tenth transistor having a source connected to the second power supply terminal, a gate and a drain both connected to the drain of the ninth transistor, and a channel of the first conductivity type; and an eleventh transistor having a source connected to the source of the tenth transistor, a gate connected to the gate of the tenth transistor to constitute a current mirror circuit, a drain connected to the gate of the seventh transistor, and a channel of the first conductivity type, wherein when an absolute value of a power supply voltage between the first power supply terminal and the second power supply terminal is equal to or larger than an absolute value of a first operation limiting voltage for operating the first constant current source, the third transistor, and the fourth transistor, a current of the second constant current source is allowed to flow through the ninth transistor and prevented from flowing through the current mirror circuit constituted by the tenth transistor and the eleventh transistor, and the pair of push-pull transistors performs a normal push-pull operation; and when the absolute value of the power supply voltage is smaller than the absolute value of the first operation limiting voltage and equal to or larger than an absolute value of a second operation limiting voltage for operating the second constant current source and the ninth transistor, the current of the second constant current source is prevented from flowing through the ninth transistor and allowed to flow through the current mirror circuit constituted by the tenth transistor and the eleventh transistor, and the eighth transistor performs a constant current source operation and only the first transistor performs a normal amplification operation.

* * * * *